US006404031B1

(12) United States Patent
Hane et al.

(10) Patent No.: US 6,404,031 B1
(45) Date of Patent: Jun. 11, 2002

(54) TRANSPARENT SEMICONDUCTOR LIGHT-RECEIVING ELEMENT AND MANUFACTURING METHOD THEREOF

(75) Inventors: Kazuhiro Hane, Nakayama 9-21-5, Aoba-ku, Sendai 981-0952; Minoru Sasaki, Sendai, both of (JP)

(73) Assignee: Kazuhiro Hane, Sendai (JP)

( * ) Notice: Subject to any disclaimer, the term of this patent is extended or adjusted under 35 U.S.C. 154(b) by 0 days.

(21) Appl. No.: 09/192,584

(22) Filed: Nov. 17, 1998

(30) Foreign Application Priority Data

Apr. 30, 1998 (JP) .......................................... 10-120848

(51) Int. Cl.[7] .......................... H01L 31/06; H01L 31/00
(52) U.S. Cl. ........................ 257/466; 257/443; 257/447; 257/461; 257/464; 250/370.14; 438/66; 438/81
(58) Field of Search ................................. 257/443, 466, 257/464, 461, 447; 438/81, 66; 250/370.14

(56) References Cited

U.S. PATENT DOCUMENTS

| 4,366,377 | A | * | 12/1982 | Notthoff et al. | ......... | 250/211 J |
|---|---|---|---|---|---|---|
| 4,857,980 | A | * | 8/1989 | Hoeberechts | ................ | 357/30 |
| 5,406,109 | A | * | 4/1995 | Whitney | ..................... | 257/467 |
| 5,536,964 | A | * | 7/1996 | Green et al. | ................ | 257/432 |
| 5,852,322 | A | * | 12/1998 | Speckbacher | ............... | 257/459 |

OTHER PUBLICATIONS

No. 29p–D–18, Extended Abstracts (the 45th Spring Meeting, Mar. 28, 1998); The Japan Society of Applied Physics and Related Societies No. 3.
From Japanese Newspaper "Nikkan Kogyo Shinbua" Jan. 27, 1998 p. 29 attached.
From O plus E, Jan. 15, 1998, pp. 50–56 attached.
Sasaki, et al: "Transparent Si Photodiode", MOEMS97, Technical Digest, Nov. 18–21, 1997, IEEE/LEOS IEEJ/ SAMS International Conference on Optical MEMS and Their Applications, pp. 62–66.

* cited by examiner

Primary Examiner—Tom Thomas
Assistant Examiner—Donghee Kang
(74) Attorney, Agent, or Firm—Pillsbury Winthrop LLP

(57) ABSTRACT

If a semiconductor device employing semiconductor light-receiving elements is disposed on a single optical axis, laser light which is incident on these light-receiving elements is interrupted by the semiconductor device, and it will be impossible to confirm as a whole that the alignment of a multiplicity of components disposed over a distance has been correctly adjusted. This problem is overcome by using a semiconductor light-receiving element with a structure which absorbs only some of a received laser light beam and which allows the greater part of the beam to be transmitted to its rear face.

10 Claims, 8 Drawing Sheets

TRANSPARENT SEMICONDUCTOR LIGHT-RECEIVING ELEMENT AND MANUFACTURING METHOD THEREOF

BACKGROUND OF THE INVENTION

The present invention claims priority from Japanese Patent Application No. 10-120848 filed Apr. 30, 1998, which is incorporated herein by reference.

1. Field of the Invention

The present invention relates to the structure of a semiconductor light-receiving element capable of transmitting laser light, and to a manufacturing method thereof. Semiconductor light-receiving elements capable of transmitting laser light can be utilized as sensors for the alignment of precision machine tools and electron microscopes.

2. Description of Related Art

On a precision machine tool it is necessary to align a plurality of components with an accuracy of 1 $\mu$m over a distance of several meters. Laboratory equipment involving lasers also requires the same degree of accuracy in the alignment of optical axes. A laser diode is used as the light source for such alignment, and semiconductor light-receiving elements such as photodiodes are used as optical sensors for receiving the laser light emitted by this laser diode. There are known techniques of using photodiodes in combination with a laser diode.

FIG. 1 shows an example of an alignment of components by means of a reference beam of laser light. In this example, photodiodes are used as the semiconductor light-receiving elements. As shown in FIG. 1, light source 40 is disposed parallel to, and at one end of, components 50, 51 and 52 requiring alignment, and emits laser light with a small spot size. This laser light is received using semiconductor devices 30, 31 and 32. These semiconductor devices are mechanically mounted on components 50, 51 and 52, and have photodiodes with extremely small light-receiving areas. A known structure for such semiconductor devices 30, 31 and 32 comprises a plurality of photodiodes formed on a single light-receiving surface. By identifying which of these photodiodes receives the laser light, the alignment can be automatically adjusted.

In such prior art, when semiconductor device 30 is disposed as a light-receiving sensor on the single optical axis, the laser light will be interrupted by this semiconductor device. If it is necessary to align a multiplicity of components 50, 51 and 52 disposed over a relatively long distance, then semiconductor devices 30, 31 and 32 will have to be used and adjusted one by one, starting from the semiconductor device nearest light source 40. When the position adjustment has been completed for a given semiconductor device, it has to be removed from the optical axis so that the next component can be aligned. This complicates the alignment operation and makes it necessary to repeat the operation. Further, it is impossible to confirm as a whole that all components 50, 51 and 52 have been correctly adjusted.

FIG. 2 shows an example of the alignment of components using a reference beam of laser light, and beam splitters in order to overcome the problems noted above. In the example shown in FIG. 2, beam splitters 20, 21 and 22, which may be semitransparent mirrors or prisms, are respectively mounted on components 50, 51 and 52, and the optical axes branched off by these beam splitters are aligned by receiving light by means of semiconductor devices 30, 31 and 32. FIG. 3 shows the relation between a beam splitter and a semiconductor device. However, in the example of FIG. 2, the optical system is complicated and the optical axes of beam splitters 20, 21 and 22 are not exactly co-linear, resulting in noise being produced in the beam wavefront. Moreover, after the beam is propagated over a long distance, spot shape and beam spreading can become distorted.

If the semiconductor device used as a light-receiving sensor is transparent so that the laser light which one semiconductor device utilizes for the alignment of a component can be transmitted without further contrivance, and other semiconductor devices are able to utilize this laser light for the alignment of other components, then problems of the sort described above can be solved.

SUMMARY OF THE INVENTION

The present invention has been created in view of this technical background. It is an object of this invention to provide a semiconductor light-receiving element with a structure which absorbs only some of the received light beam and which allows the greater part to be transmitted to its rear face. It is a further object of this invention to simplify the operation of mechanically aligning components on an optical axis. It is yet another object of this invention to provide a device which, when a multiplicity of components are to be aligned, enables the alignment of all the components to be confirmed as a whole.

According to a first aspect, this invention is a semiconductor light-receiving element formed on part of a semiconductor bulk as a diaphragm which is sufficiently thin to allow the transmission of laser light.

Because this enables laser light which has been transmitted through one semiconductor light-receiving element to reach another semiconductor light-receiving element, it is for example possible to adjust the alignment of a plurality of components by using laser light with a single optical axis as a common reference beam. The alignment operation can therefore be simplified, and when a multiplicity of components are to be aligned, the alignment of all the components as a whole can be confirmed.

According to a second aspect, this invention is directed to a semiconductor device including a plurality of the aforesaid semiconductor light-receiving elements formed in extremely close proximity on a single semiconductor bulk. A separate electrode is provided on each of these semiconductor light-receiving elements.

If the semiconductor device has two light receiving elements, the position at which a laser spot hits the semiconductor device can be detected in one dimension by for example shining a laser spot, which constitutes a single point, on the semiconductor device and measuring the difference in the photocurrents generated by these two semiconductor light-receiving elements.

An alternative configuration is possible. Namely, if the semiconductor device has four light receiving elements, the four semiconductor light-receiving elements are disposed in respective quadrants demarcated by imaginary orthogonal X and Y axes on the aforesaid diaphragm. By disposing the semiconductor light-receiving elements in this manner, the position at which a laser spot hits the semiconductor device can be detected in two dimensions by for example shining a laser spot, which constitutes a single point, on the semiconductor device and measuring the differences in the photocurrents generated by these four semiconductor light-receiving elements.

According to a third aspect, this invention is directed to a manufacturing method for a transparent semiconductor light-receiving element. The manufacturing method includes etching a silicon substrate of one conduction type from its rear face until it is sufficiently thin to allow transmission of laser light, doping the etched portion from the front face with a dopant of the opposite conduction type, and forming an electrode for the electrical connection on this doped portion.

According to a fourth aspect, this invention is directed to a semiconductor light-receiving element which is different from the aforesaid semiconductor light-receiving element formed as a diaphragm, wherein the equivalent of a transparent semiconductor light-receiving element can be formed by providing a passage or passages as a lattice-like structure. Light can pass through the passage(s) from the front to the rear face of a semiconductor bulk. The passage(s) is (are) provided in a region which includes a light-receiving part which has been formed on part of the front face of the semiconductor bulk.

A semiconductor light-receiving element formed in this manner can be used in the same way as the aforesaid semiconductor light-receiving element formed as a diaphragm. Namely, it can be applied to a semiconductor device, a plurality of the semiconductor light-receiving elements can be formed in extremely close proximity on a single semiconductor bulk, a separate electrode can be provided on each of these semiconductor light-receiving elements, a passage or passages through which light can pass can be formed as a lattice-like structure, and the number of light receiving elements can be 2 or 4.

An alternative configuration is as follows. Namely, if the number of light receiving objects is 4, the four semiconductor light-receiving elements are disposed in respective quadrants demarcated by imaginary orthogonal X and Y axes on the aforesaid diaphragm.

BRIEF DESCRIPTION OF THE DRAWINGS

Preferred embodiments of the present will be described in detail with reference to the accompanying drawings, wherein.

DETAILED DESCRIPTION OF THE PREFERRED EMBODIMENTS

Figure 1:
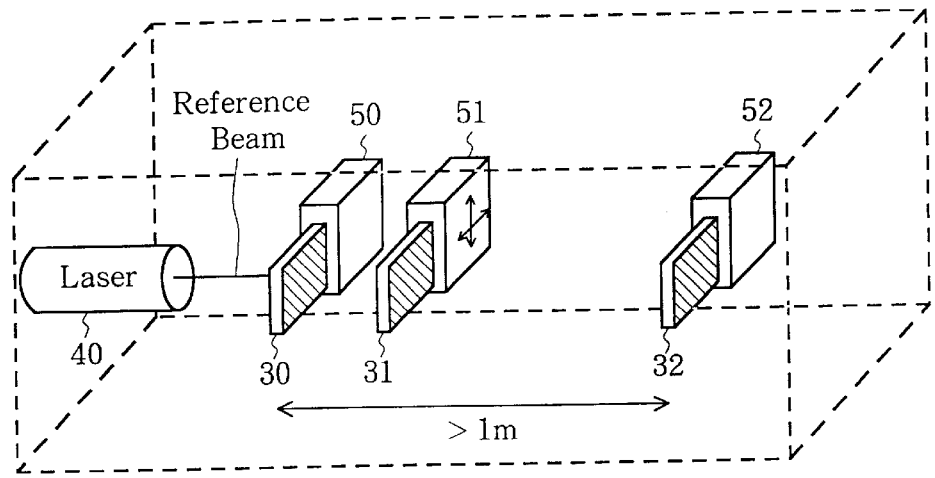
FIG. 1 shows an example of conventional alignment of components using a reference beam of laser light.
Figure 2:
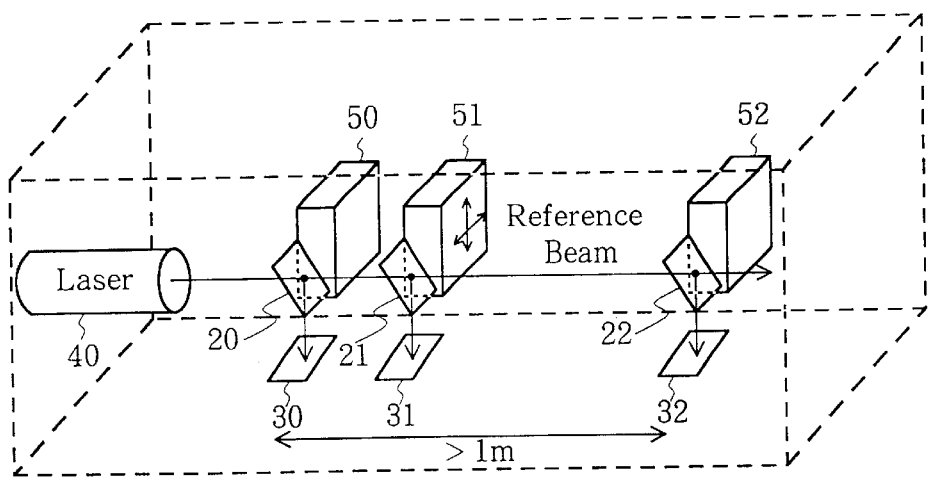
FIG. 2 shows an example of the alignment of components using a reference beam of laser light using beam splitters.
Figure 3:
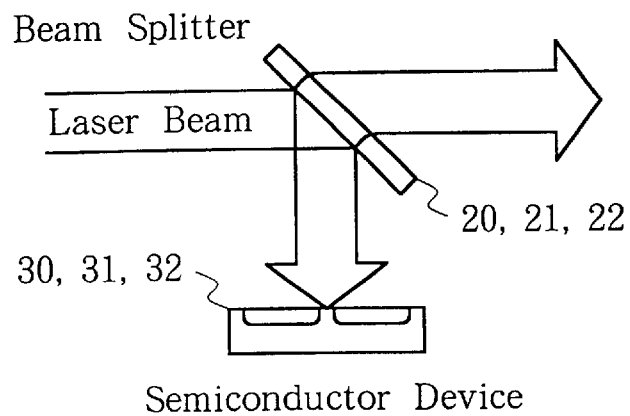
FIG. 3 shows the relation between a beam splitter and photodiodes.
Figure 4:
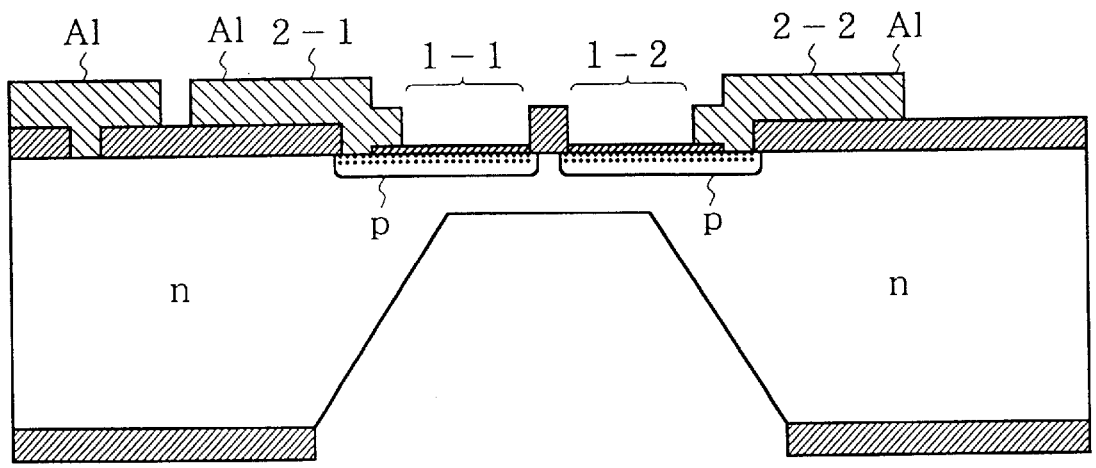
FIG. 4 shows the configuration of a semiconductor device which uses diaphragm photodiodes according to a first embodiment of this invention.
Figure 5:
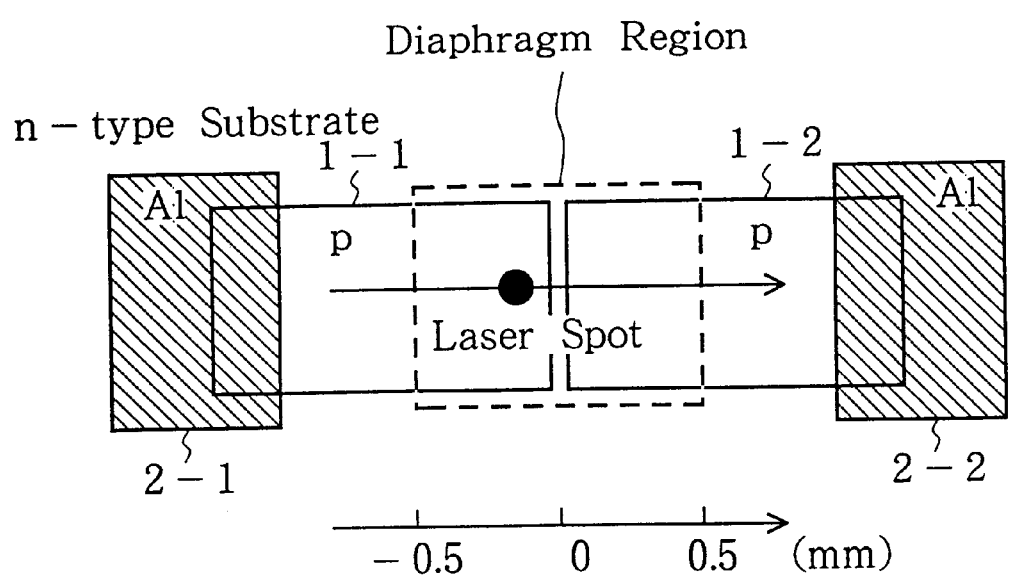
FIG. 5 shows an example of a semiconductor device which uses two diaphragm photodiodes according to a first embodiment of this invention.
Figure 9:
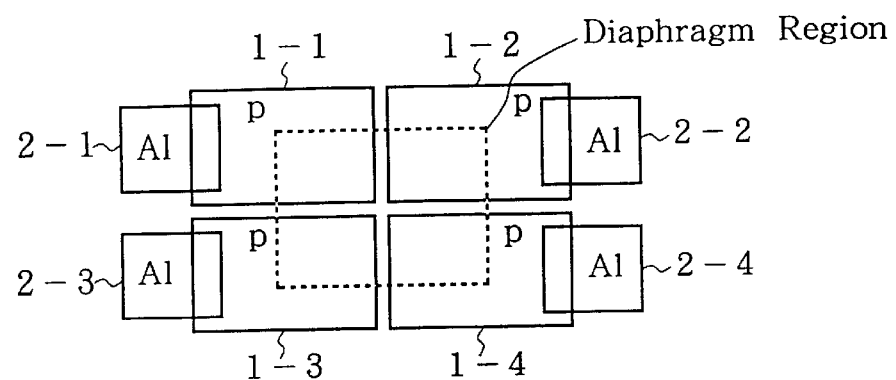
FIG. 9 shows an example of a semiconductor device which uses four diaphragm photodiodes according to a first embodiment of this invention.
Figure 10:
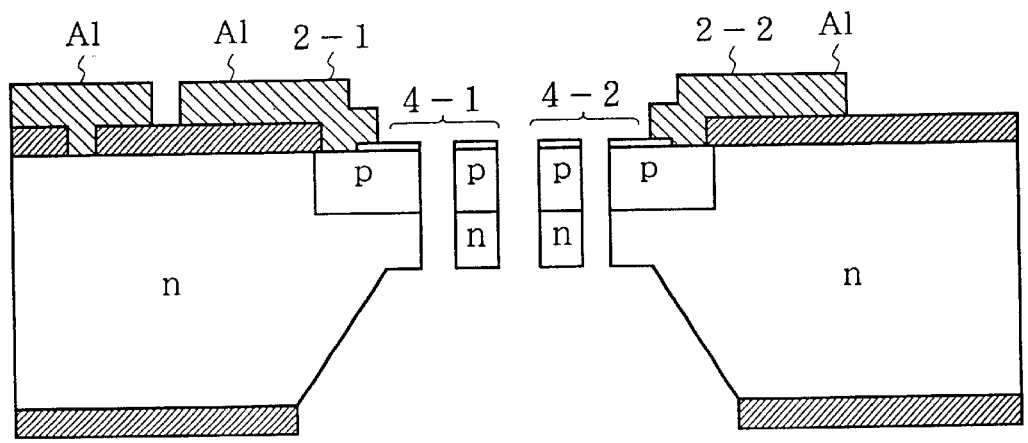
FIG. 10 shows the configuration of a semiconductor device which uses lattice-type photodiodes according to a second embodiment of this invention.
Figure 11:
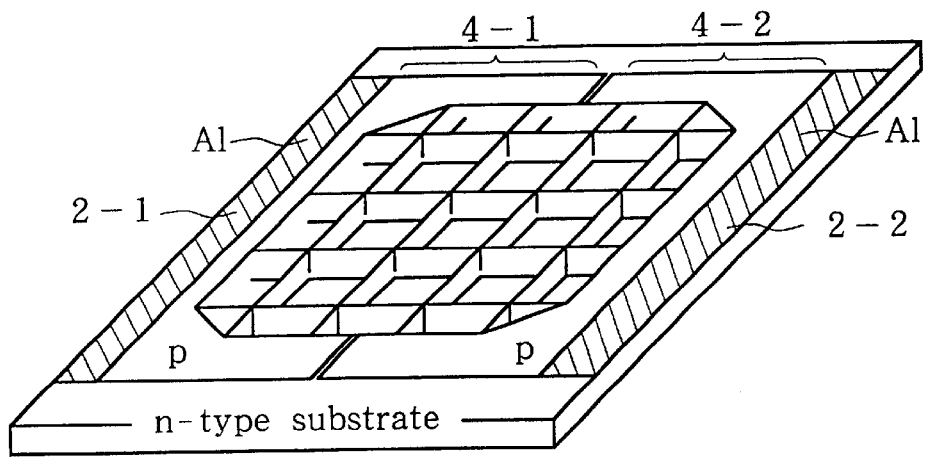
FIG. 11 is a perspective view of a semiconductor device which uses lattice-type photodiodes according to a second embodiment of this invention.
Figure 13:
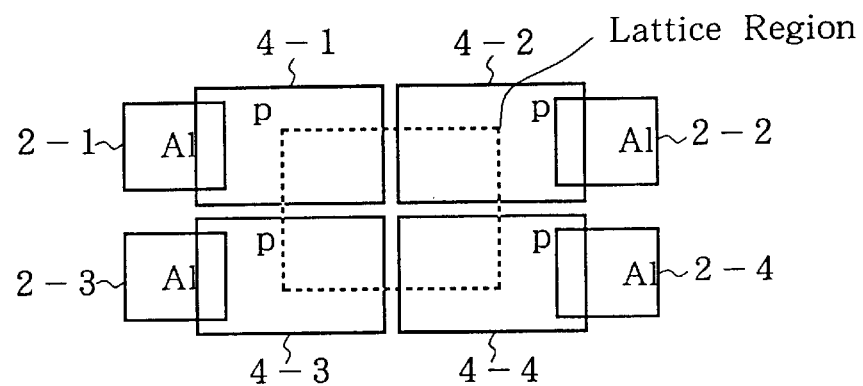
FIG. 13 shows an example of a semiconductor device which uses four lattice-type photodiodes according to a second embodiment of this invention.

Embodiments of the invention will be explained with reference to FIG. 4, FIG. 5, FIG. 9, FIG. 10, FIG. 11 and FIG. 13 . FIG. 4 shows the configuration of a semiconductor device which uses diaphragm photodiodes according to a first embodiment of this invention. FIG. 5 shows an example of a semiconductor device which uses two diaphragm photodiodes according to a first embodiment of this invention. FIG. 9 shows an example of a semiconductor device which uses four diaphragm photodiodes according to a first embodiment of this invention. FIG. 10 shows the configuration of a semiconductor device which uses lattice-type photodiodes according to a second embodiment of this invention. FIG. 11 is a perspective view of a semiconductor device which uses lattice-type photodiodes according to a second embodiment of this invention. FIG. 13 shows an example of a semiconductor device which uses four lattice-type photodiodes according to a second embodiment of this invention. Although the explanation which will be given here relates to the use of photodiodes as the semiconductor light-receiving elements, this does not restrict the scope of this invention to photodiodes.

A first embodiment of this invention comprises, as shown in FIG. 4, photodiodes 1-1 and 1-2 formed on part of a semiconductor bulk as a diaphragm which is sufficiently thin to allow transmission of laser light. Electrodes 2-1 and 2-2 are provided on photodiodes 1-1 and 1-2, respectively. The semiconductor device shown in FIG. 5 comprises two photodiodes 1-1 and 1-2 formed in extremely close proximity on a single semiconductor bulk, with a separate electrode 2-1 and 2-2 provided on each of these photodiodes 1-1 and 1-2. A diaphragm region is formed in the portion surrounded by the broken line in FIG. 5. Alternatively, as shown in FIG. 9, the semiconductor device comprises four photodiodes 1-1 to 1-4 formed in extremely close proximity on a single semiconductor bulk, with a separate electrode 2-1 to 2-4 provided on each of these photodiodes 1-1 to 1-4. In this case, these four photodiodes 1-1 to 1-4 are disposed in respective quadrants demarcated by imaginary orthogonal X and Y axes on the aforesaid diaphragm. A diaphragm region is formed in the portion surrounded by the broken line in FIG. 9.

A second embodiment of this invention includes, as shown in FIG. 10 and FIG. 11, at least one passage through which light can pass from the front to the rear face of the semiconductor bulk in a region which includes photodiodes 4-1 and 4-2. These photodiodes 4-1 and 4-2 are the light-receiving parts which have been formed on part of the semiconductor bulk. The respective electrodes 2-1 and 2-2 are provided on each photodiode 4-1 and 4-2 with a lattice-like structure.

Alternatively, when using photodiodes with a lattice-like structure according to the second embodiment, a semiconductor device according to this invention can be configured as shown in FIG. 13. Four photodiodes 4-1 to 4-4 are formed in extremely close proximity on a single semiconductor bulk. Separate electrode 2-1 to 2-4 are respectively provided on each of these photodiodes 4-1 to 4-4, and passages through which light can pass are formed as a lattice-like structure in the lattice region shown by the broken line in FIG. 13. In this case, these four photodiodes 4-1 to 4-4 are disposed in respective quadrants demarcated by imaginary orthogonal X and Y axes on the aforesaid diaphragm.

Figure 6:
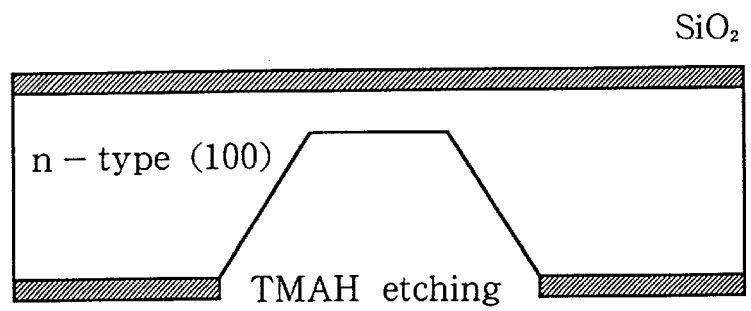
FIGS. 6(a)–6(c) show the steps involved in manufacturing transparent photodiodes according to a first embodiment of this invention.
Figure 6:
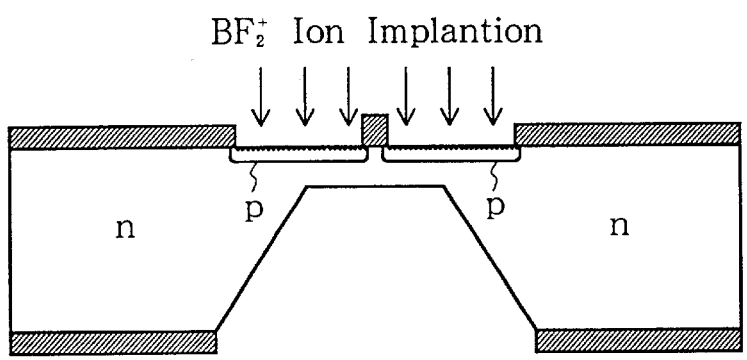
Figure 6:
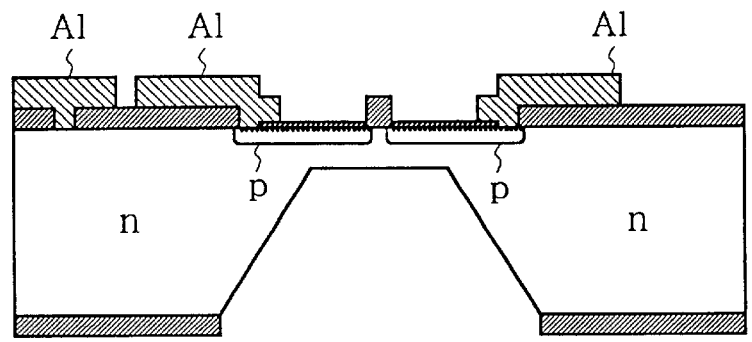

A first embodiment of this invention will now be explained. FIG. 6 shows the steps involved in manufacturing transparent photodiodes according to this first embodiment, which relates to the case in which, in order to fabricate transparent photodiodes, the photodiodes are formed as a diaphragm which is sufficiently thin to allow transmission of light. As shown in FIG. 6(*a*), using a silicon substrate (n-type, (100) orientation, 5–8 Ω·cm, 200 μm thick), a diaphragm portion is fabricated by anisotropic etching from the rear face with 25% TMAH (tetramethylammonium hydroxide) solution at 70C. The etching time is determined by estimating the diaphragm thickness by Fourier transform infrared spectroscopy. The portion through which light can be transmitted is approximately a 1 mm square, and a large number of such portions are fabricated on a 20 mm square wafer. Etching rate varies slightly according to position on the wafer, and measurements of the film thickness of each element exhibit a variability of from 4.4 to 6.1 Ωm. Next, as shown in FIG. 6(*b*), the oxide film on the front face is patterned and boron is implanted (100 keV, $BF_2+$, $2.0\times10^{14}$ atoms/$cm^2$), whereby photodiodes with shallow pn junctions (approximately 200 nm deep) are fabricated. Finally, as shown in FIG. 6(*c*), aluminum electrodes are formed.

Figure 7:
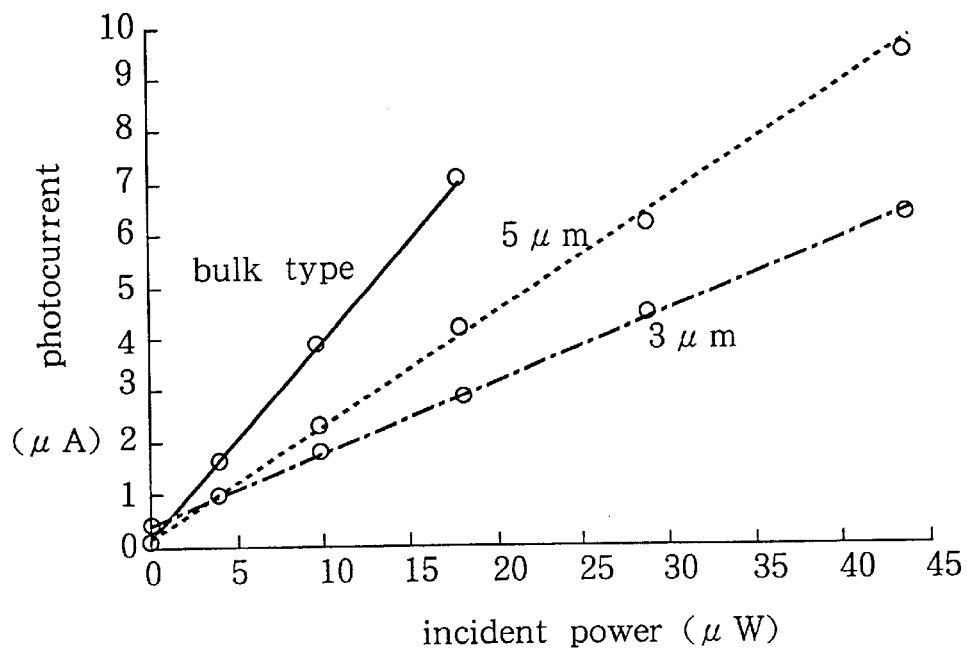
FIG. 7 shows the dependence of photocurrent on the amount of incident laser light at a wavelength of 780 nm, with a bias voltage of −1.0 V.

The transmittance of a diaphragm photodiode fabricated in this manner is 33% at 834 nm, 12% at 780 nm, and 8.0% at 633 nm. The absorption coefficient of silicon is smaller at longer wavelengths and therefore silicon exhibits a higher transmittance at longer wavelengths. By comparison, bulk photodiodes were fabricated using the same conditions apart from omitting the step involving creation of the diaphragm, and the characteristics of these photodiodes were examined. The results of this comparison can be explained with reference to FIG. 7, which shows the dependence of photocurrent on the amount of incident laser light at a wavelength of 780 nm, with a bias voltage of −1.0 volts. Here, incident power (μW) is plotted along the horizontal axis and photocurrent (μA) along the vertical axis. Whereas the sensitivity of a bulk photodiode (solid line) is 0.39 A/W, that of a 5 μm diaphragm photodiode (broken line) is 0.21 A/W, and that of a 3 μm diaphragm photodiode (dot-and-dash line) is 0.13 A/W.

Figure 8:
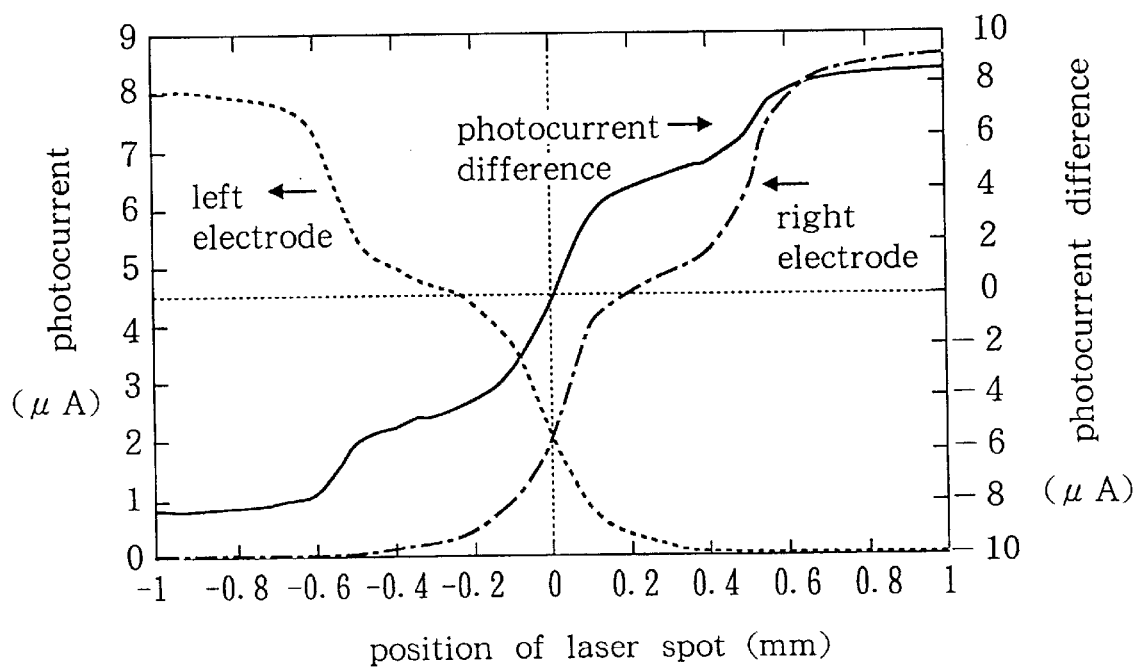
FIG. 8 shows the photocurrents obtained at the left and right electrodes, and the difference between these photocurrents, when a laser beam with a 375 μm spot size was moved over two diaphragm photodiodes.

FIG. 8 shows the photocurrents obtained at the left and right electrodes (broken line: left electrode; dot-and-dash line: right electrode) and the difference between these photocurrents (solid line) when a laser beam with a 375 μm spot size was moved over a semiconductor device employing two diaphragm photodiodes as shown in FIG. 5. In FIG. 8, laser spot position (in mm) is plotted on the horizontal axis, while photocurrent (in μA) and photocurrent difference (also in μA) are plotted along the left and right vertical axes, respectively. The region of steep gradient in the vicinity of 0 mm in the plot of photocurrent difference is due to the spot shifting between the two cells. The slope becomes less steep in the regions in the vicinity of ±0.3 mm. This is due to the lower sensitivity of the diaphragm portion. The regions of steep slope at ±0.5 mm are due to the change in substrate thickness. The regions in the vicinity of ±0.8 mm are regions of thick substrate.

The position of a laser spot can thus be detected from the difference in photocurrents. In this embodiment, because laser spot position is detected in one dimension, its position in the vertical direction in FIG. 5 cannot be determined. The laser spot position can be detected in two dimensions by means of a semiconductor device which uses four diaphragm photodiodes. 1-1 to 1-4 as shown in FIG. 9. In this case, the diaphragm region is formed in the portion surrounded by the broken line shown in FIG. 9. In other words, the relation between laser spot position and photocurrent or photocurrent difference shown in FIG. 8 is applied also to the vertical direction of FIG. 9, with the result that the position of a laser spot on the semiconductor device illustrated in FIG. 9 can be detected in two dimensions.

A second embodiment of this invention will now be explained with reference to FIG. 10 and FIG. 11. In this second embodiment, the following method was conceived for obtaining transparent photodiodes. Namely, the photodiodes are fabricated in the form of a fine lattice which captures some of the light but allows the greater part of the light to be transmitted without being affected at all. In this embodiment, the diameter of the light beam is made considerably larger than the lattice period. FIG. 10 shows the structure of a semiconductor device which uses lattice-type photodiodes. Because the portions which transmit light actually pass through the substrate, they do not produce any distortion of the wavefront.

A semiconductor device of the sort depicted in FIG. 10 is manufactured by employing anisotropic etching to turn part of the silicon into a fairly thin diaphragm, fabricating photodiodes, and then through-etching the lattice portions using reactive inductively coupled plasma etching. Namely, photodiodes thicker than the diaphragm photodiodes of the first embodiment are formed by steps similar to those depicted in FIG. 6(*a*) and FIG. 6(*b*), and lattice portions are through-etched in the photodiodes by reactive etching with an inductively coupled plasma. Electrodes for electrical connection are then formed in the vicinity of the lattice portions thus formed, in similar manner to those shown in FIG. 6(*c*).

Incident laser light is diffracted when it passes through the lattice, but because the lattice portion has a small surface area, this diffraction effect is small. The diffracted waves deviate from the optical axis by the diffraction angle, which is determined by the lattice period. Therefore once the diffracted waves have left the optical axis, there is no distortion of the wavefront, other than a slight drop in the amount of light. The transmission through the lattice therefore has very little effect on the propagation of the lightwave. The lattice is a square lattice with a period of 100 μm or 50 μm. The width of the lattice portions is 5 μm and their thickness is 40 μm. The lattice structure has an aspect ratio of 8. The angle of diffraction of 0.5 μm wavelength light due to a lattice with a period of 100 μm is 0.3 degrees, and therefore the light is diffracted by 1 cm after a distance of 2 m. Consequently, at this order of distance, because the diffracted waves have left the optical axis, wavefront disturbance is almost entirely eliminated. The width to period ratio of the fabricated lattice is 5%, and calculation of the optical transmittance from the area ratio gives a figure of 90%. Optical loss is 10% and so transmittance is high. Pn junction photodiode portions are fabricated in the regions to the left and right of the lattice to provide two lattice-type photodiodes.

Figure 12:
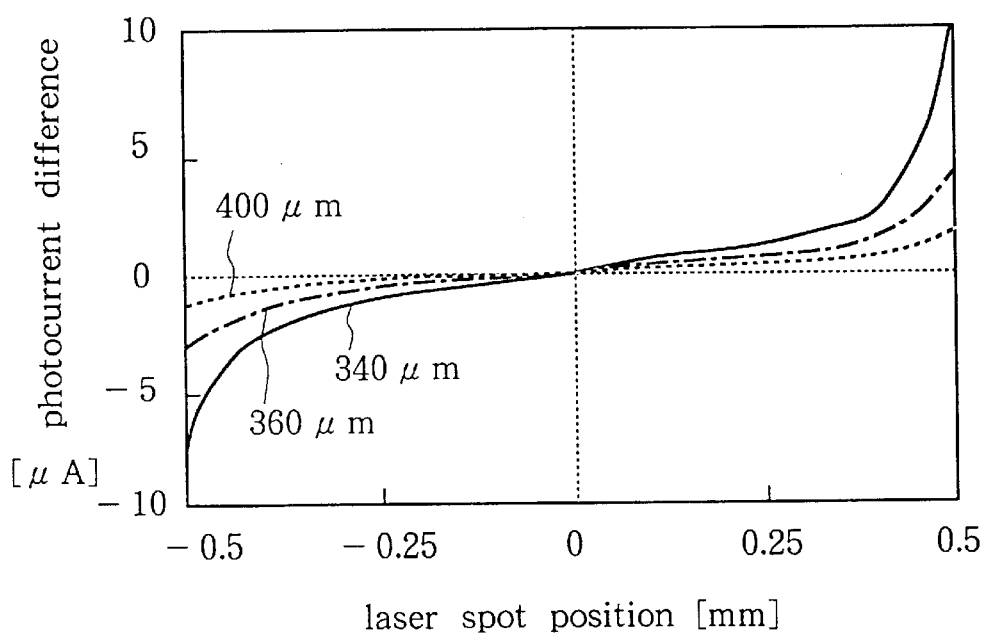
FIG. 12 shows the response of lattice-type photodiodes.

FIG. 12 shows the response of lattice-type photodiodes, with the position of the laser spot (in mm) plotted on the horizontal axis and the photocurrent difference (in μA) plotted along the vertical axis. The difference between the photocurrents of the two photodiodes 4-1 and 4-2 was measured for laser light with spot sizes of 340 μm (the solid line), 360 μm (the dot-and-dash line), and 400 μm (the broken line). The fact that the photocurrent difference signal increases in the regular way shown in FIG. 12 confirms that this device can operate as a spot position sensor.

The position of a laser spot can thus be detected from the difference in photocurrents. In this embodiment, because laser spot position is detected in one dimension, its position in the longitudinal direction in FIG. 11 cannot be determined. Laser spot position can be detected in two dimensions by means of a semiconductor device which uses four lattice-type photodiodes 4-1 to 4-4 as shown in FIG. 13. The lattice region is formed in the portion surrounded by the broken line shown in FIG. 13. In other words, the relation between the laser spot position and photocurrent difference shown in FIG. 12 is applied also to the vertical direction in FIG. 13, with the result that the position of a laser spot on the semiconductor device illustrated in FIG. 13 can be detected in two dimensions.

Figure 14:
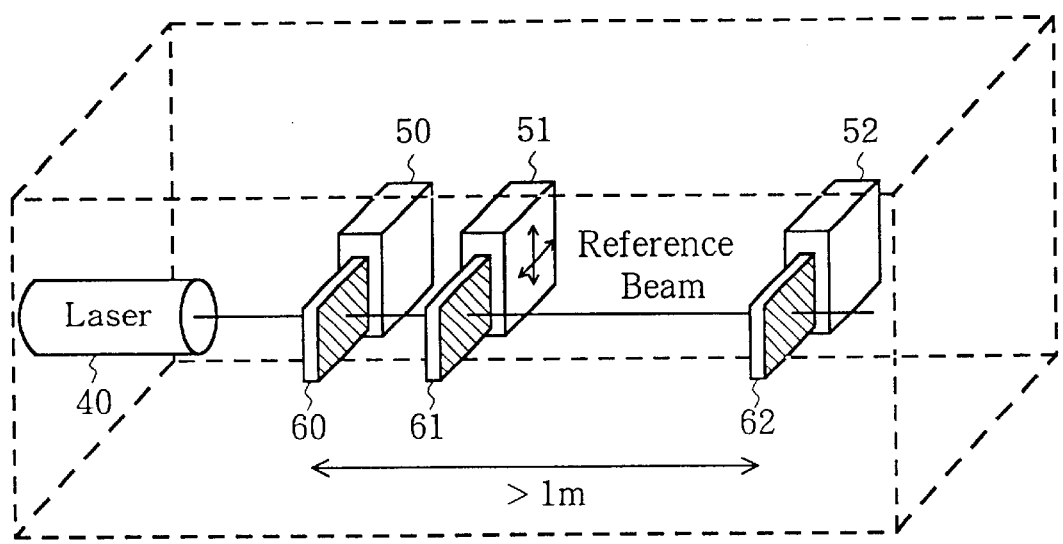
FIG. 14 shows the operation of aligning a plurality of components.

An example of a practical application which uses the transparent semiconductor light-receiving elements according to this invention will be described with reference to FIG. 14, which shows the operation of aligning a plurality of components as a first practical application. By using semiconductor devices 60, 61 and 62 which employ transparent photodiodes according to this invention, the light beam which has been transmitted through first semiconductor device 60 reaches second and third semiconductor devices 61 and 62 as well (see FIG. 14), with the result that a plurality of components 50, 51 and 52 can be aligned using a single common optical axis. The alignment operation can therefore be simplified and the overall alignment can be confirmed.

As has been explained above, the present invention provides a semiconductor light-receiving element with a structure which absorbs only some of the received light beam and which allows the greater part to be transmitted to its rear face. As a result, the operation of mechanically aligning components on an optical axis can be simplified. In addition, if a multiplicity of components are to be aligned, the alignment of all the components as a whole can be confirmed.

What is claimed is:

1. An apparatus comprising:

a semiconductor bulk; and at least one semiconductor light-receiving element formed as a p-n junction having a depth of up to approximately 200 nm on part of said semiconductor bulk;

wherein said at least one light-receiving element forms a diaphragm which is sufficiently thin to allow transmission of laser light.

2. A semiconductor device comprising:

a single semiconductor bulk; and a plurality of semiconductor light-receiving elements formed on said single semiconductor bulk so as to form a diaphragm which is sufficiently thin to allow the transmission of laser light and is arranged in close proximity to each other on said single semiconductor bulk, each of said plurality of semiconductor light receiving elements being formed as a p-n junction having a depth of up to approximately 200 nm;

wherein a separate electrode is provided on each of said plurality of semiconductor light-receiving elements.

3. A semiconductor device according to claim 2, wherein said semiconductor device includes two light receiving elements.

4. A semiconductor device according to claim 2, wherein said semiconductor device includes four light receiving elements.

5. A semiconductor device according to claim 4, wherein the four semiconductor light-receiving elements are disposed in respective quadrants demarcated by imaginary orthogonal X and Y axes on said diaphragm.

6. An apparatus comprising:

a semiconductor bulk; and a semiconductor light-receiving element having at least one passage through which light can pass from a front face to a rear face of said semiconductor bulk formed in a region which includes a light-receiving part which has been formed on part of the front face of the semiconductor bulk;

wherein said semiconductor light-receiving element is a lattice on said semiconductor bulk.

7. A semiconductor device comprising:

a single semiconductor bulk;

a plurality of semiconductor light-receiving elements formed on said single semiconductor bulk so as to provide at least one passage through which light can pass from a front face to a rear face of said single semiconductor bulk, said plurality of light-receiving elements being arranged in close proximity on said single semiconductor bulk; and a separate electrode formed on each of said plurality of semiconductor light-receiving elements;

wherein said at least one passage through which light can pass is formed as a lattice-like structure.

8. A semiconductor device according to claim 7, wherein said semiconductor device includes two light receiving elements.

9. A semiconductor device according to claim 7, wherein said semiconductor device includes four light receiving elements.

10. A semiconductor device according to claim 9, wherein the four semiconductor light-receiving elements are disposed in respective quadrants demarcated by imaginary orthogonal X and Y axes on said diaphragm.

* * * * *